United States Patent
Miyazawa et al.

(10) Patent No.: US 7,522,388 B2
(45) Date of Patent: Apr. 21, 2009

(54) MAGNETORESISTANCE EFFECT ELEMENT HAVING A LOWER MAGNETIC LAYER FORMED OVER A BASE SUBSTRATE THROUGH A TRANSITION METAL OXIDE LAYER HAVING A PREDETERMINED ORIENTATION PLANE

(75) Inventors: Hiromu Miyazawa, Suwa (JP); Takamitsu Higuchi, Suwa (JP); Setsuya Iwashita, Suwa (JP)

(73) Assignee: Seiko Epson Corporation (JP)

( * ) Notice: Subject to any disclaimer, the term of this patent is extended or adjusted under 35 U.S.C. 154(b) by 430 days.

(21) Appl. No.: 11/034,273

(22) Filed: Jan. 12, 2005

(65) Prior Publication Data

US 2005/0152075 A1 Jul. 14, 2005

(30) Foreign Application Priority Data

Jan. 13, 2004 (JP) .............................. 2004-005412

(51) Int. Cl.
G11B 5/127 (2006.01)

(52) U.S. Cl. ...................................................... 360/324

(58) Field of Classification Search ................ 360/324, 360/324.1, 324.11, 324.12, 324.2
See application file for complete search history.

(56) References Cited

U.S. PATENT DOCUMENTS

| | | | | |
|---|---|---|---|---|
| 4,980,339 A | * | 12/1990 | Setsune et al. | 505/235 |
| 6,156,376 A | * | 12/2000 | Paranthaman et al. | 427/126.3 |
| 6,251,834 B1 | * | 6/2001 | Glowacki et al. | 505/239 |
| 6,432,546 B1 | * | 8/2002 | Ramesh et al. | 428/448 |
| 6,583,034 B2 | * | 6/2003 | Ramdani et al. | 438/507 |
| 6,594,120 B2 | | 7/2003 | Odagawa et al. | 360/313 |
| 6,649,570 B2 | * | 11/2003 | Belouet | 505/237 |
| 6,849,861 B2 | | 2/2005 | Iwashita et al. | 257/13 |
| 6,930,339 B2 | * | 8/2005 | Higuchi et al. | 257/295 |
| 6,984,843 B2 | | 1/2006 | Higuchi et al. | 257/16 |
| 7,220,498 B2 | | 5/2007 | Nagahama et al. | 428/811.1 |
| 2002/0030945 A1 | * | 3/2002 | Odagawa et al. | 360/313 |
| 2003/0017723 A1 | * | 1/2003 | Hiramoto et al. | 438/958 |
| 2005/0096230 A1 | | 5/2005 | Iwashita et al. | 505/190 |
| 2007/0128470 A1 | | 6/2007 | Nagahama et al. | 428/811.1 |

FOREIGN PATENT DOCUMENTS

| | | |
|---|---|---|
| JP | 09-256152 | 9/1997 |
| JP | 2000-012920 | 1/2000 |
| JP | 2000-357828 | 12/2000 |

OTHER PUBLICATIONS

Zhi G. Wang et al., IEEE Trans Mag. 33(1997), "Feasibility of Ultra-Dense Spin-Tunneling Random Acess Memory", pp. 4498-4512.

* cited by examiner

*Primary Examiner*—Allen T Cao
(74) *Attorney, Agent, or Firm*—Harness, Dickey & Pierce, P.L.C.

(57) ABSTRACT

A magnetoresistance effect element is provided and includes a memory layer, an insulating layer and a fixed magnetic layer successively stacked on a substrate. The memory layer is formed on the substrate through a transition metal oxide layer having a predetermined orientation plane. A buffer layer is preferably provided on a lower layer side of the transition metal oxide layer.

17 Claims, 3 Drawing Sheets

MAGNETORESISTANCE EFFECT ELEMENT HAVING A LOWER MAGNETIC LAYER FORMED OVER A BASE SUBSTRATE THROUGH A TRANSITION METAL OXIDE LAYER HAVING A PREDETERMINED ORIENTATION PLANE

RELATED APPLICATIONS

This application claims priority to Japanese Patent Application No. 2004-005412 filed Jan. 13, 2004 which is hereby expressly incorporated by reference herein in its entirety.

BACKGROUND

1. Technical Field

The present invention relates to magnetoresistance effect elements and methods for manufacturing the same, and magnetic memory devices.

2. Related Art

In recent years, magnetic memory devices (MRAMs: Magnetic Random Access Memories) are attracting attention as memory devices that can be alternatives to DRAMs (Dynamic Random Access Memories) and SRAMs (Static Random Access Memories). MRAM are advantageous because they are nonvolatile, and capable of high-speed operations and higher recording density, and therefore are viewed as promising data storage memories and system memories for portable electronic equipment (see, for example, Wang et al., IEEE Trans Magn. 33 (1997), 4498).

A MRAM is equipped with tunneling magnetoresistance elements (TMR elements) each having a ferromagnetic tunneling junction structure formed from a ferromagnetic layer/insulating layer/ferromagnetic layer as a memory cell, and stores differences in the tunneling resistance in the insulating layer caused by changing of the spin direction (parallel/anti-parallel) of the ferromagnetic layers that sandwich the insulating layer in the TMR element, in association with data "1" and "0."

In order to operate an MRAM stably, it is important that a stable tunneling effect can be obtained at each of the TMR elements, and the magnetic characteristic of each of the ferromagnetic layers and the uniformity of the insulation layer composing the element greatly affect the tunneling effect. For example, the insulation layer needs to be formed thin to about 1 nm, and variations in its film thickness need to be suppressed below 10%. Also, in order to obtain a good magnetic characteristic in the magnetic layers, it is important to form them with a uniform film quality. In particular, when they are composed of crystalline magnetic thin films, their magnetic characteristic is greatly influenced by the crystallinity.

However, the ferromagnetic layer is generally formed on an insulating film that is composed of an oxide having an amorphous structure such as silicon oxide, and it is difficult to form an epitaxial film on such an insulating layer. Accordingly, there is a problem in that it is difficult to obtain a ferromagnetic layer having a good crystallinity.

The present invention has been made in view of the problems of the conventional technology, and its object is to provide magnetoresistance effect elements equipped with magnetic layers having good crystallinity and excellent magnetic characteristic, and methods for manufacturing the same.

It is also an object of the present invention to provide magnetic memory devices that excel in operation stability.

SUMMARY

In order to solve the problems described above, the present invention provides a magnetoresistance effect element comprising a lower magnetic layer, an insulating layer and an upper magnetic layer successively stacked on a base substrate, wherein the magnetoresistance effect element is characterized in that the lower magnetic layer is formed over the base substrate through a transition metal oxide layer having a predetermined orientation plane.

With the structure described above, because the lower magnetic layer is formed on the transition metal oxide layer formed with a predetermined orientation plane, the lower magnetic layer can be crystal-grown excellently on the transition metal oxide layer, such that the magnetoresistance effect element can be provided with an excellent magnetic characteristic. Accordingly, the MR ratio of the element can be improved, and the magnetoresistance effect element can be provided with excellent noise characteristic and operation stability.

In the magnetoresistance effect element in accordance with the present invention, the lower magnetic layer may preferably include a layer composed of a magnetic material having a perovskite structure. With this structure, the lower magnetic layer composed of an epitaxial film that can crystal-grows excellently on the transition metal oxide layer and has an excellent magnetic characteristic can be obtained.

In the magnetoresistance effect element in accordance with the present invention, the transition metal oxide layer may preferably be composed of a transition metal oxide having a perovskite structure. With this structure, the crystallinity of the lower magnetic layer can be further improved, such that the MR ratio of the element can be made higher.

In the magnetoresistance effect element in accordance with the present invention, the transition metal oxide layer may preferably be a (100) oriented epitaxial film. With this structure, the layer of magnetic material having a perovskite structure can be epitaxially grown excellently, and the lower magnetic layer can be obtained with a better crystallinity.

In the magnetoresistance effect element in accordance with the present invention, the transition metal oxide layer may preferably be composed of at least one kind selected from $SrRuO_3$, Nb—$SrTiO_3$, La—$SrTiO_3$, and (La, Sr) $CoO_3$. By using a transition metal oxide selected from among the aforementioned materials, the magnetic material having a perovskite structure can be epitaxially grown excellently, and the transition metal oxide layer itself is equipped with an excellent conductivity, such that the transition metal oxide layer can be used well as an electrode for the element.

The transition metal oxide layer may preferably be formed in a film by an ion beam assisted method. With this structure, the transition metal oxide layer that is epitaxially grown without depending on the surface condition of the base substrate can be obtained, and the lower magnetic layer to be formed thereon can be epitaxially grown excellently. Accordingly, the magnetoresistance effect element can be obtained with excellent characteristics even on, for example, a silicon substrate surface where a natural oxide film is formed, or on a substrate surface where an interlayer insulating layer is formed.

In the magnetoresistance effect element in accordance with the present invention, the transition metal oxide layer may preferably be formed in a film over the base substrate through a buffer layer that is formed in a film by an ion beam assisted method. With this structure, the transition metal oxide layer can be epitaxially grown more excellently.

In the magnetoresistance effect element in accordance with the present invention, the buffer layer may preferably include a (100) oriented epitaxial film. With this structure, the transition metal oxide layer having a (100) orientation can be readily crystal-grown on the buffer layer, and the transition metal oxide layer that can control the orientation of the lower magnetic layer in a predetermined orientation can be obtained. Accordingly, the lower magnetic layer to be formed on the transition metal oxide layer is grown with a predetermined orientation plane, and is equipped with a good magnetic characteristic.

In the magnetoresistance effect element in accordance with the present invention, the buffer layer may preferably include a layer composed of an oxide having an NaCl structure, a fluorite structure, or a layered perovskite structure. With this structure, the buffer layer that can excellently crystal-grow the transition metal oxide layer to be formed on the buffer layer can be readily obtained.

In the magnetoresistance effect element in accordance with the present invention, the insulating layer may preferably be an epitaxial film that is crystal-grown on the lower magnetic layer. With this structure, the insulating layer becomes to be an epitaxial film, such that it has a better insulating property and can better insulate the upper magnetic layer from the lower magnetic layer, and becomes to be an insulating film having a uniform insulating property within its forming region, such that it can provide a structure with which a magnetoresistance effect element equipped with a uniform characteristic can be readily formed.

In the magnetoresistance effect element in accordance with the present invention, the insulating layer may preferably be composed of an insulating material of a metal oxide having a perovskite structure. When the insulating layer has a perovskite structure, it can be epitaxially grown better on the lower magnetic layer when the lower magnetic layer is composed of a magnetic material having a perovskite structure, such that the insulating layer can be obtained with an especially excellent insulating property.

In the magnetoresistance effect element in accordance with the present invention, the upper magnetic layer may preferably include an epitaxial film that is crystal-grown on the insulating layer. With this structure, the upper magnetic layer can also be provided with an excellent magnetic characteristic, and can provide a structure that can contribute to an improvement of the MR ratio of the element.

In the magnetoresistance effect element in accordance with the present invention, the upper magnetic layer may preferably be composed of a magnetic material of a metal oxide having a perovskite structure. Because the upper magnetic layer is made to have a perovskite structure, it can be epitaxially grown readily and excellently on the insulating layer having a perovskite structure. Accordingly, it is possible to provide a magnetoresistance effect element equipped with excellent magnetic characteristic and insulation property, in which each of its lower magnetic layer, insulating layer and upper magnetic layer is an excellent epitaxial film.

In the magnetoresistance effect element in accordance with the present invention, at least a surface of the base substrate may be composed of an insulating oxide or an organic insulating material which has an amorphous structure. In other words, in accordance with the present invention, a magnetoresistance effect element equipped with a lower magnetic layer having a good crystallinity can be obtained without regard to surface conditions of a base substrate.

A method for manufacturing a magnetoresistance effect element in accordance with the present invention pertains to a method for manufacturing a magnetoresistance effect element equipped with a lower magnetic layer, an insulating layer and an upper magnetic layer successively stacked on a base substrate, and is characterized in comprising: a step of forming a transition metal oxide layer having a predetermined orientation plane on the base substrate; and a step of forming the lower magnetic layer on the transition metal oxide layer by epitaxial growth.

According to the manufacturing method described above, it is possible to obtain a lower magnetic layer that is epitaxially grown with an excellent crystallinity whose orientation is highly controlled by a transition metal oxide layer formed with its orientation controlled in a predetermined direction by using an ion beam assisted method, such that the lower magnetic layer can be obtained with an excellent magnetic characteristic. Accordingly, by the present manufacturing method, a magnetoresistance effect element with a high MR ratio can be manufactured.

Also, a method for manufacturing a magnetoresistance effect element in accordance with the present invention pertains to a method for manufacturing a magnetoresistance effect element equipped with a lower magnetic layer, an insulating layer and an upper magnetic layer successively stacked on a base substrate, and is characterized in comprising: a step of forming a buffer layer having a predetermined orientation plane on the base substrate by an ion beam assisted method; a step of forming a transition metal oxide layer on the buffer layer by epitaxial growth; and a step of forming the lower magnetic layer on the transition metal oxide layer by epitaxial growth.

According to the manufacturing method described above, the buffer layer whose orientation is controlled in a predetermined direction is formed on the base substrate, and the transition metal oxide layer and the lower magnetic layer are successively formed on the buffer layer, such that the lower magnetic layer composed of an epitaxial film with an excellent crystallinity and the transition metal oxide layer having an excellent crystallinity can be obtained, and a magnetoresistance effect element equipped with the transition metal oxide layer that can be used as an electrode of high performance can be manufactured.

In the method for manufacturing a magnetoresistance effect element in accordance with the present invention, the lower magnetic layer that is composed of a magnetic material having a perovskite structure may preferably be formed on the transition metal oxide layer. By the manufacturing method described above, a magnetic layer that can be readily epitaxially grown on a layer composed of a transition metal oxide and provide a high MR ratio can be formed.

In the method for manufacturing a magnetoresistance effect element in accordance with the present invention, the transition metal oxide layer may preferably be formed by epitaxially growing a transition metal oxide having a perovskite structure to a (100) orientation. By the manufacturing method described above, it is particularly convenient to epitaxially grow a magnetic layer composed of a metal oxide having a perovskite structure, In the method for manufacturing a magnetoresistance effect element in accordance with the present invention, the step of forming the buffer layer by an ion beam assisted method may preferably include a step of forming a first buffer layer on the base substrate, using an ion beam assisted method, and a step of forming a second buffer layer on the first buffer layer by epitaxial growth. By the manufacturing method described above, a buffer layer that can epitaxially grow the transition metal oxide layer particularly well can be obtained.

The method for manufacturing a magnetoresistance effect element in accordance with the present invention may preferably be further equipped with a step of forming a third buffer layer composed of a metal oxide having a perovskite structure on the second buffer layer by epitaxial growth. By the manufacturing method described above, a buffer layer that can epitaxially grow the transition metal oxide layer even better can be obtained.

Next, a magnetic memory device in accordance with the present invention pertains to a magnetic memory device equipped with a plurality of memory cells arranged on a base substrate, and is characterized in that each of the memory cells is equipped with the magnetoresistance effect element described above. With this structure, there can be provided a magnetic memory device equipped with a high performance magnetoresistance effect element as its memory cell that has a lower magnetic layer, an insulating layer and an upper magnetic layer, each of which is formed with an excellent crystallinity, and that has a high MR ratio and a large operation margin.

In the magnetic memory device in accordance with the present invention, a wiring connected to the memory cell may be formed on the base substrate, and a transition metal oxide layer or a buffer layer of the magnetoresistance effect element may preferably form at least a part of an electroconductive connecting section between the wiring and the memory cell. With this structure, the electroconductive connecting section to each of the memory cells can be formed concurrently in the step of forming the magnetoresistance effect element.

In the magnetic memory device in accordance with the present invention, the magnetoresistance effect element may preferably be formed through a buffer layer over the base substrate, and the plurality of the memory cells may preferably commonly share the buffer layer. With this structure, because each of the memory cells shares the buffer layer, the magnetoresistance effect elements of the respective memory cells have few variations in their characteristic, and have a large operation margin. By this, a magnetic memory device that is capable of stable operation can be provided.

DETAILED DESCRIPTION

Magnetoresistance Effect Element

Figure 1:
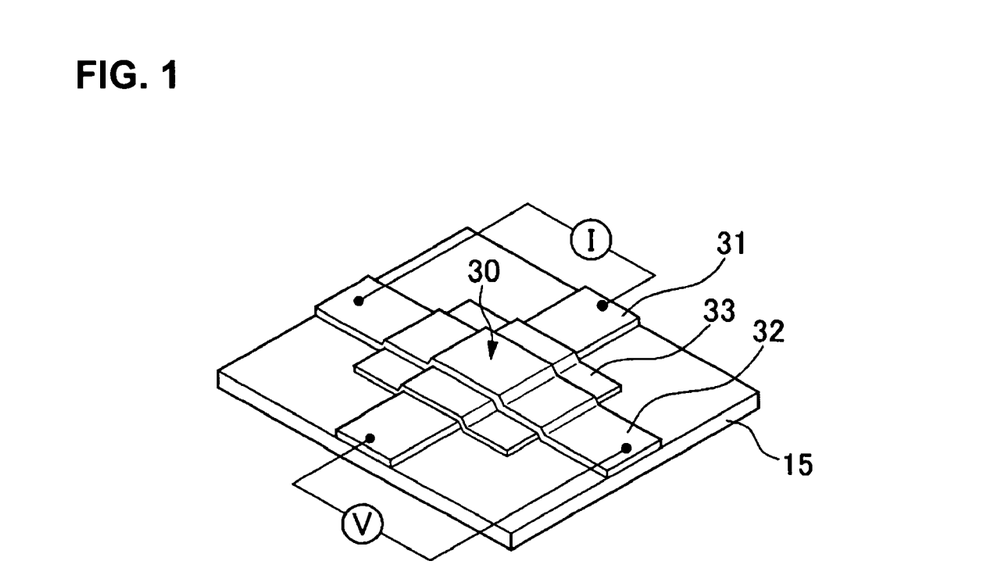
FIG. 1 is a perspective view of a structure of a magnetoresistance effect element in accordance with an embodiment.
Figure 2:
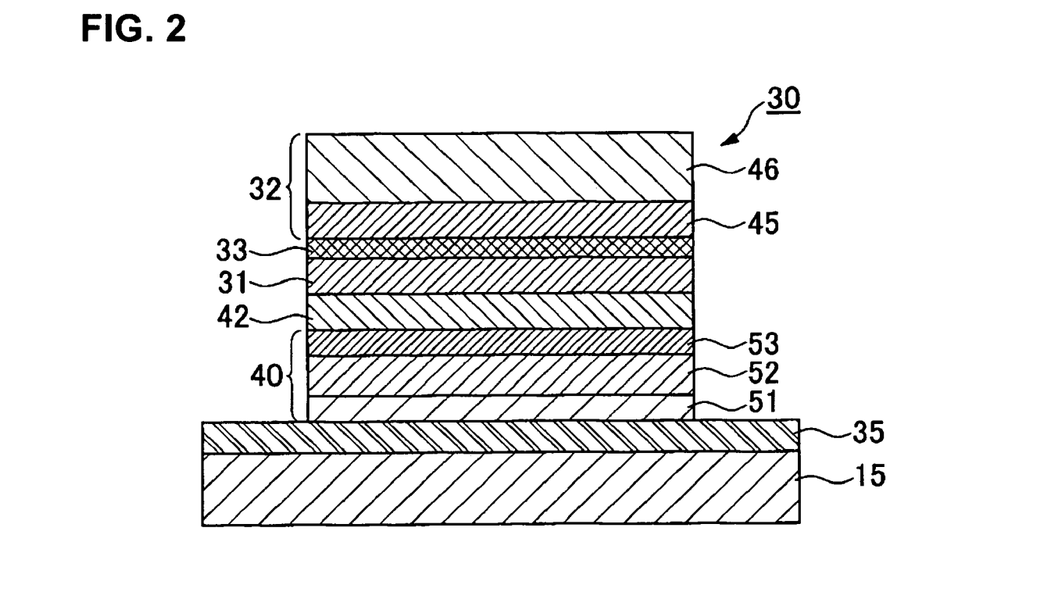
FIG. 2 is a cross-sectional view of the structure of the same.

Embodiments of the present invention are described with reference to the accompanying drawings. FIG. 1 is a perspective structural view of a tunneling type magnetoresistance effect element (hereafter abbreviated as a TMR element) in accordance with an embodiment of the present invention, and FIG. 2 is a cross-sectional structural view of a TMR element 30 shown in FIG. 1.

As shown in FIG. 1, the TMR element 30 has a structure in which an insulating layer 33 is sandwiched between a memory layer (lower magnetic layer) 31 and a fixed magnetic layer (upper magnetic layer) 32 disposed mutually crossing one another over a substrate (base substrate) 15, and is formed at a position corresponding to an intersection between the memory layer and the fixed magnetic layer. In its cross-sectional structure, the TMR element 30 has a structure shown in FIG. 2 in which a buffer layer 40, a transition metal oxide layer 42, the memory layer 31, the insulating layer 33 and the fixed magnetic layer 32 are successively stacked on an insulating film 35 formed on the substrate 15. Also, the fixed magnetic layer 32 has a structure in which a magnetic fixed layer 45 and an anti-ferromagnetic layer 46 are stacked in this order from the side of the insulating layer 33.

It is noted that, in the structure described above, the lower magnetic layer defines a memory layer (free layer), and the upper magnetic layer defines a fixed magnetic layer (pinned layer). However, a structure in which the lower magnetic layer defines a pinned layer, and the upper magnetic layer defines a free layer is also permitted. Also, in accordance with the present embodiment, the TMR element 30 has a structure that is provided with a single layer of the insulating layer 33, but may have a structure in which two insulating layers and a ferromagnetic layer sandwiched between them are provided between the memory layer 31 and the fixed magnetic layer 32. In this structure, the ferromagnetic layer sandwiched between the plural insulating layers defines a memory layer.

The transition metal oxide layer 42 is a layer composed of a conductive or insulating transition metal oxide (details thereof are described below), and in particular, it may preferably be composed of a metal oxide having a perovskite structure, and may preferably be oriented in a pseudo cubic with a (100) orientation. Also, to achieve such an orientation state, the buffer layer 40 may be provided.

The memory layer 31 is a layer whose magnetization direction is inverted by a magnetic field caused by a write current as it is used in a magnetic memory device, and its magnetization direction can be changed in parallel or anti-parallel with the magnetization direction of the fixed magnetic layer 32. As a material that composes the memory layer, an alloy composed of two kinds or more selected from Ni, Fe and Co, a magnetic material of a metal oxide having a perovskite structure, magnetite, $CrO_2$, a Heusler alloy, such as, NiMnSb, PtMnSb and the like, or the like can be used. The material composing the memory layer 31 may contain elements, such as, for example, Ag, Cu, Au, Al, Mg, Si, Bi, Ta, B, C, O, N, Pd, Pt, Zr, Ir, W, Mo, Nb and the like, in such a range that the ferromagnetism is not lost.

In the present embodiment, in particular, a magnetic material of a metal oxide having a perovskite structure, such as, for example, $La_{0.7}Sr_{0.3}MnO_3$ is preferred because the transition metal oxide layer 42 is provided.

Such a metal oxide epitaxially grows excellently on the transition metal oxide layer 42, such that a good MR ratio can be obtained. It is noted that a magnetic material other than a metal oxide of a perovskite structure may also be permissible as long as it can be epitaxially grown on the transition metal oxide layer 42.

The insulating layer 33 magnetically isolates the memory layer 31 from the magnetic fixed layer 45 to be described below, and has a function to flow a tunneling current. Although an aluminum oxide having a thickness of 0.5 nm-5 nm is typically used, the insulating layer 33 in accordance with the present embodiment may preferably be composed of a metal oxide having a perovskite structure that can be epitaxially grown well on the memory layer 31 that defines a lower layer, and can provide a good insulation. As an insulating metal oxide having a perovskite structure, for example, $SrTiO_3$, $BaTiO_3$, $CaTiO_3$, or the like can be enumerated. Further, the provision of the insulating layer 33 that is epitaxially grown on the memory layer 31 is preferred because it is effective in improving the crystallinity of the magnetic fixed layer 45 that is formed on the insulating layer 33.

It is noted that, as the insulating layer 33, for example, aluminum oxide, magnesium oxide, silicon oxide, aluminum nitride, magnesium nitride, silicon nitride, aluminum oxinitride, magnesium oxinitride, silicon oxinitride, tantalum oxide, niobium oxide or the like can also be used. In particular, aluminum oxide can provide a high degree of insulation, such that a memory element using the same can exhibit an excellent MR ratio.

The fixed magnetic layer 32 is composed of the magnetic fixed layer (pinning layer) 45 and the anti-ferromagnetic layer (pinned layer) 46 stacked in this order from the side of the insulating layer 33. The magnetic fixed layer 45 is a layer whose magnetization direction is fixed as it is anti-ferromagnetically bonded with the anti-ferromagnetic layer 46, When it is used in a magnetic memory device, its magnetization is not inverted by a magnetic field caused by a write current, and is maintained in a constant magnetization direction. As the magnetic fixed layer 45, an alloy composed of two or more kinds selected from Ni, Fe, and Co, or a magnetic material of a metal oxide having a perovskite structure can be used. In particular, when an insulation material of a metal oxide having a perovskite structure ($La_{0.7}$ $Sr_{0.3}$ $MnO_3$ or the like) is used, it can be epitaxially grown well on the insulating layer 33, and is effective in improving the magnetic characteristic.

The anti-ferromagnetic layer 46 is a layer for fixing the magnetization direction of the magnetic fixed layer 45. As a material composing the anti-ferromagnetic layer 46, a Mn alloy containing Fe, Ni, Pt, Ir, Rh or the like, a Co oxide, Ni oxide, or the like can be used. Further, a layer composed of a magnetic material such as FeNi can be provided as a cover layer on an outer side (an upper surface side as illustrated) of the anti-ferromagnetic layer 46.

The buffer layer 40 and the transition metal oxide layer 42, which are characteristic of the TMR element 30 in accordance with the present embodiment, are described below in detail.

The buffer layer 40 may be acceptable if it has a single orientation (wherein its orientation direction is aligned only in a thickness direction), and may preferably have an in-plane orientation (wherein its orientation direction is aligned in all three-dimensional directions). By providing the buffer layer 40 described above, an excellent bondability (an adhesion) can be obtained between the substrate 15 on which the insulating film 35 such as a silicon oxide layer is formed and the transition metal oxide layer 42 to be described below.

The buffer layer 40 may preferably include at least one type of a metal oxide having an NaCl structure, a metal oxide having a fluorite structure, and a metal oxide having a perovskite structure, and more particularly, it may preferably have a structure in which a metal oxide having an NaCl structure or a metal oxide having a fluorite structure, and a metal oxide having a perovskite structure are stacked. Lattice mismatch of a metal oxide having a NaCl structure or a metal oxide having a fluorite structure is small with a metal oxide having a perovskite structure, such that, when, in particular, a film of transition metal oxide having a perovskite structure is to be formed as the transition metal oxide layer 42, as described below, there is an advantage in forming a layer having a perovskite structure that serves as its groundwork.

For the reasons described above, the buffer layer 40 in accordance with the present embodiment is formed from a first buffer layer 51 and a second buffer layer 52 each being composed of a metal oxide having an NaCl structure or a metal oxide having a fluorite structure, and a third buffer layer 53 that is composed of a metal oxide having a perovskite structure and formed on the second buffer layer 52.

The first buffer layer 51 is a buffer layer that is formed by an ion beam assisted method, in particular, in accordance with the present invention, and is composed of yttria stabilized zirconia (hereafter referred to as YSZ) having a cubic (100) orientation in accordance with the present embodiment, which is formed thick, for example, to a thickness of about 1 μm. It is noted that yttria stabilized zirconia expressed by the following formula can be optionally used.

$Zr_{1-x}Ln_xO_y$, (where $0 \leq x \leq 1.0$, and Ln is one type of metal element selected from Y, La, Ce, Pr, Nd, Sm, Eu, Gd, Tb, Dy, Ho, Er, Tm, Yb and Lu.)

It is noted here that the first buffer layer 51 may be formed thick as it is convenient when the TMR element 30 is applied to a memory cell of a magnetic memory device. In other words, when the stacked layered films are patterned by etching, the first buffer layer 51 can be made to function as an etching stopper.

The first buffer layer 51 may be formed directly on the substrate 51. However, a silicon oxide film, a polyimide film defining an interlayer insulating layer, or another organic insulating film may often be formed on the surface of the substrate 15, and a silicon substrate or the like may have a natural oxidation film formed thereon. It is difficult to epitaxially grow YSZ on such an insulating film 35 by an ordinary film forming method. Accordingly, in the present embodiment, in particular, an ion beam assisted method is used for epitaxial growth, as described below, thereby forming the first buffer layer 51. It is noted that the insulating layer 35 formed on the surface of the substrate 15 may be an amorphous film.

The second buffer layer 52 is composed of $CeO_2$ having a cubic (100) orientation, and is epitaxially grown on the first buffer layer 51. The thickness thereof may be about 100 nm, for example.

It is noted that the first buffer layer 51 and the second buffer layer 52 are not limited to YSZ or $CeO_2$, but can use a metal oxide having an optional NaCl structure or a metal oxide having a fluorite structure. As the metal oxide having a NaCl structure, for example, MgO, CaO, SrO, BaO, MnO, FeO, CoO, NiO, and a solid solution including them may be enumerated, but among them, in particular, at least one type of MgO, CaO, SrO, BaO, and a solid solution including them may preferably be used. Such a metal oxide having a NaCl structure has particularly small lattice mismatch with a metal oxide having a perovskite structure.

On the hand, as the metal oxide having a fluorite structure, for example, YSZ (yttria stabilized zirconia), $CeO_2$, $ZrO_2$, $ThO_2$, $UO_2$, and a solid solution containing them can be enumerated, but among them, in particular, at least one type of YSZ, $CeO_2$, $ZrO_2$ and a solid solution containing them may preferably be used. Such a metal oxide having a fluorite structure also has particularly small lattice mismatch with a metal oxide having a perovskite structure.

Next, the third buffer layer 53 is composed of $YBa_2Cu_3O_x$ (x is 7, for example) which is a layered perovskite type oxide, epitaxially grown on the second buffer layer 52 to an orthorhombic (100) orientation, and formed to have a thickness of about 30 nm, for example. The third buffer layer 53, as it is formed from a metal oxide having a perovskite structure, has particularly small lattice mismatch with the second buffer layer 52, as described above. Accordingly, the third buffer layer 53 has an excellent crystal structure without defects, and the transition metal oxide layer 42 having a perovskite structure can be epitaxially grown excellently on the third buffer layer 53.

It is noted that the third buffer layer 53 is not limited to $YBa_2Cu_3O_x$, and can used other perovskite type metal oxides. For example, $CaRuO_3$, $SrRuO_3$, $BaRuO_3$, $SrVO_3$, (La, Sr) $MnO_3$, (La, Sr) $CrO_3$, (La, Sr) $CoO_3$, or a solid solution containing them can also be used.

Next, the transition metal oxide layer 42 may preferably be composed of a perovskite type metal oxide like the third buffer layer 53, which may be epitaxially grown to a pseudocubic (100) orientation, and may preferably be formed to a thickness of about 50 nm, for example. As a perovskite type metal oxide that forms the transition metal oxide layer 42, a metal oxide that can be used as the third buffer layer 53 can be used as it is, but above all, at least one type selected from $SrRuO_3$, Nb—$SrTiO_3$, La—$SrTiO_3$, and (La, Sr)$CoO_3$ may preferably be used. It is noted here that Nb—$SrTiO_3$ is $SrTiO_3$ doped with Nb, and La—$SrTiO_3$ is $SrTiO_3$ doped with La. These metal oxides excel in conductivity and chemical stability, such that the transition metal oxide layer 42 formed form them also excels in conductivity and chemical stability. Also, on this layer, a perovskite type magnetic metal oxide, such as, for example, $La_{0.7}Sr_{0.3}MnO_3$, can be excellently formed, and the memory layer 31 of an epitaxial film can be formed.

Then, in accordance with the present embodiment, the insulating layer 33 is formed on the memory layer 31 having a perovskite structure epitaxially grown on the transition metal oxide layer 42, and therefore the insulating layer 33 may preferably be composed of material having a perovskite type crystal structure, such as, for example, $SrTiO_3$, and may preferably be the one that can be epitaxially grown on the memory layer 31. Furthermore, when the insulating layer 33 is an epitaxial film, a perovskite type magnetic metal oxide, such as, for example, $La_{0.7}Sr_{0.3}MnO_3$ may be used for the magnetic fixed layer 45 to be formed thereon, such that the magnetic fixed layer 45 of an epitaxial film can be obtained, and its magnetic characteristic can be made excellent. When both of the memory layer 31 and the magnetic fixed layer 45 are formed from epitaxial films, noise that may be caused by magnetization appearing among these layers in a thickness direction of the layers can be prevented, and an excellent MR characteristic can be obtained.

In this manner, in the TMR element 30 in accordance with the present embodiment, the memory layer 31, the insulating layer 33 and the magnetic fixed layer 45 are successively stacked on the transition metal oxide layer 42 that is formed over the substrate 15 through the buffer layer 40, such that the memory layer 31 having an excellent crystallinity can be obtained, compared to the case where the memory layer 31 is formed directly on the insulating film 35, and therefore an excellent MR characteristic can be obtained. In particular, if metal oxides having a perovskite structure are used as forming materials for these layers, the memory layer 31, the insulating layer 33 and the magnetic fixed layer 45 can be successively, epitaxially grown on the transition metal oxide layer 42, such that the TMR element can have a higher MR ratio.

Method for Manufacturing Magnetoresistance Effect Element

Next, a method for manufacturing a magnetoresistance effect element is described with reference to FIG. 2.

To manufacture the TMR element 30 having the structure described above, first, a substrate 15 is prepared. The substrate is not limited to any particular constituting material, but a Si substrate with a surface having a (100) plane is typically used. In the case of a Si substrate, its surface normally has a natural oxidation film formed thereon, which provides a substrate surface condition similar to the case of the embodiment described above where the TMR element 30 is formed over the insulating film 35. Also, when a magnetic memory device is manufactured using such a substrate, transistors are formed on a Si substrate, and a silicon oxide film or a polyimide film is provided as an interlayer insulating film that covers the transistors, such that the use of the same also provides a state similar to the case where the TMR element 30 is formed over the insulating film 35.

When the substrate 15 is prepared, the substrate 15 is mounted on a substrate holder, and placed in a vacuum apparatus (not shown). Within the vacuum apparatus, targets (targets for buffer layers) containing constituting elements of the aforementioned buffer layers 51, 52 and 53, respectively, and targets containing constituting elements of the transition metal oxide layer 42, the memory layer 31, the insulating layer 33 and the fixed magnetic layer 32, respectively, are disposed opposite to and separated from the substrate 15 at a predetermined distance. It is noted that the targets to be preferably used may be composed of the same compositions as or similar compositions to those of the first buffer layer 51, the second buffer layer 52, the third buffer layer 53, the transition metal oxide layer 42, the memory layer 31, the insulating layer 33, and the fixed magnetic layer 32, respectively, to be obtained.

More specifically, as the target for the first buffer layer 51, a desired YSZ composition or a composition similar to the same is used; as the target for the second buffer layer 52, a desired $CeO_2$ composition or a composition similar to the same is used; and as the target for the third buffer layer 53, a desired $YBa_2Cu_3O_x$ composition or a composition similar to the same is used, Also, as the target for the transition metal oxide layer 42, for example, a $SrRuO_3$ composition or a composition similar to the same is used. As the target for the memory layer 31 and the magnetic fixed layer 45, for example, a $La_{0.7}Sr_{0.3}MnO_3$ composition or a composition similar to the same is used. As the target for the insulating layer 33, for example, a $SrTiO_3$ composition or a composition similar to the same is used. Furthermore, as the target for the anti-ferromagnetic layer 46, for example, a FeMn composition or a composition similar to the same is used.

Next, a first buffer layer 51 is formed directly on the insulating film 35 by using an ion beam assisted method as described above. More specifically, by a laser ablation method in which a laser beam is irradiated at the target for the first buffer layer 51, thereby pounding out atoms including oxygen atoms and metal atoms from the target, a plume is generated. Then, the plume is irradiated toward the substrate 15, and eventually contacts the substrate 15.

Also, generally at the same time, an ion beam is irradiated (injected) at a predetermined angle to be described below with respect to the surface of the substrate 15, thereby providing an ion beam assist. Then, although the insulating film 35 is formed on the surface of the substrate 15, YSZ having a cubic (100) orientation epitaxially grows on the substrate 15, whereby the first buffer layer 51 is formed.

It is noted that, as a method to pound constituting atoms of the YSZ out of a target, other methods, such as, a method of irradiating (injecting) argon gas (inert gas) plasma, electron beams or the like to a target surface may be used, in addition to the method of irradiating a laser beam to a target surface described above. However, among these methods, the method of irradiating a laser beam to a target surface is most preferred. By using these methods, atoms can be readily and securely pounded out from a target, by using a vacuum apparatus with a simple structure that is equipped with an entrance window for a laser beam.

The laser beam to be irradiated to the target may preferably be a pulsed beam with a wavelength of about 150-300 nm, and a pulse length of about 1-100 ns. More specifically, the laser beam may be, for example, an excimer laser such as a ArF excimer laser, KrF excimer laser, a XeCl excimer laser, or the like, a YAG laser, $YVO_4$ laser, $CO_2$ laser or the like. Among the above, the ArF excimer laser and the KrF excimer laser are particularly preferred. The ArF excimer laser and the KrF excimer laser are easy to handle, and can effectively pound atoms from the target.

Further, the ion beam to be irradiated as an ion beam assist to the surface of the substrate 15 is not particularly limited, but at least one type of ions among inert gas ions, such as, for example, argon, helium, neon, xenon, and krypton ions, or mixed ions of the aforementioned ions and oxygen ions may preferably be used. As an ion source of the ion beam, for example, a Kauffman ion source or the like may preferably be used. By using this ion source, the ion beam can be relatively readily generated.

Also, the angle of irradiation (injection) of the ion beam, in other word, the aforementioned predetermined angle, with respect to the surface of the substrate 15 is not particularly limited, but may preferably be about 35-65° angled with respect to the surface of the substrate 15. In particular, when the first buffer layer 51 is formed with a metal oxide having a NaCl structure as a main material, the irradiation angle may preferably be about 42-47°. When the first buffer layer 51 is formed with a metal oxide having a fluorite structure as a main material, the irradiation angle may preferably be about 52-57°. In the present embodiment, because the first buffer layer 51 is formed with YSZ that is a metal oxide having a fluorite structure, the irradiation angle is set to about 52-57°, and particularly, at about 55°. When the ion beam is irradiated at such an irradiation angle to the surface of the substrate 15, the first buffer layer 51 having a cubic (100) orientation can be excellently formed.

Also, the laser ablation is conducted, while ions such as argon ions are injected at the target in a (111) direction. However, when the first buffer layer 51 is formed with a metal oxide having a NaCl structure such as MgO, the laser ablation is conducted, while ions such as argon ions are injected at the target in a (110) direction.

Also, conditions in forming the first buffer layer 51 are not particularly limited, as long as the first buffer layer 51 can be epitaxially grown, and the following conditions can be used, for example.

The frequency of the laser beam may preferably be 30 Hz or lower, and more preferably, 15 Hz or lower. The energy density of the laser beam may preferably be 0.5 $J/cm^2$ or greater, and more preferably, 2 $J/cm^2$ or greater. The acceleration voltage of the ion beam may preferably be about 100-300V, and more preferably, about 150-250V. Also, the irradiation amount of the ion beam may preferably be about 1-30 mA, and more preferably, about 5-15 mA.

The temperature of the substrate 15 may preferably be about 0-50° C., and more preferably, about room temperature (5-30° C.). The distance between the substrate 15 and the target may preferably be 60 mm or less, and more preferably, 45 mm or less.

The pressure inside the vacuum apparatus may preferably be $133\times10^{-1}$ Pa ($1\times10^{-1}$ Torr) or less, and more preferably, $133\times10^{-3}$ Pa ($1\times10^{-3}$ Torr) or less.

The atmosphere inside the vacuum apparatus may preferably be a mixture of inert gas and oxygen at a mixing ratio of about 300:1-10:1 in volume ratio, and more preferably, about 150:1-50:1.

By setting the film forming conditions for the first buffer layer 51 within these ranges, the first buffer layer 51 can be epitaxially grown and effectively formed.

Also, in this instance, the irradiation time of the laser beam and ion beam may be appropriately set, such that the average thickness of the first buffer layer 51 can be adjusted to the thickness described above, in other words, about 100 nm. The irradiation time of the laser beam and ion beam may differ depending on each of the conditions described above, but, normally, may preferably be 200 seconds or less, and more preferably, 100 seconds or less.

According to the method for forming the first buffer layer 51 described above, an ion beam assisted method in which the irradiation angle of the ion beam is adjusted is used. As a result, although the insulating film 35 is formed on the surface of the substrate 15, the first buffer layer 51 having a cubic (100) orientation can be excellently formed, as described above. Also, because the orientation direction of the first buffer layer 51 can be accurately aligned in the manner described above, the average thickness of the first buffer layer 51 can be further reduced.

After the first buffer layer 51 is formed in the manner described above, a second buffer layer 52 is formed on the first buffer layer 51, as shown in FIG. 2. As the second buffer layer 52 is formed on the first buffer layer 51 that has an excellent crystal structure, unlike in the case of the first buffer layer 51 that is formed on the insulating film 35, only a laser ablation method can be performed without using an ion beam assisted method.

More specifically, instead of the target for the first buffer layer 51, the target for the second buffer layer 52 containing the desired $CeO_2$ composition or a composition similar to the same is used, and a laser beam is irradiated to the target to pound out atoms including oxygen atoms and metal atoms, thereby generating a plume. Then, the plume is irradiated toward and brought in contact with the first buffer layer 51 on the substrate 15, thereby epitaxially growing and forming the second buffer layer 52.

It is noted that the film forming conditions for the laser ablation method and the like to form the second buffer layer 52 may be set similar to the conditions for the laser ablation method and the like to form the first buffer layer 51.

Next, a third buffer layer 53 is formed on the second buffer layer 52, as shown in FIG. 2, thereby obtaining a buffer layer 40 composed of the first buffer layer 51, the second buffer layer 52 and the third buffer layer 53. A laser ablation method alone is used for forming the third buffer layer 53, like in the case of the second buffer layer 52. More specifically, instead of the target for the second buffer layer 52, the target for the third buffer layer 53 containing the desired $YBa_2Cu_3O_x$ composition or a composition similar to the same is prepared, and a laser beam is irradiated to the target to pound out atoms including oxygen atoms and metal atoms, thereby generating a plume. Then, the plume is irradiated toward and brought in contact with the second buffer layer 52 on the substrate 15, thereby epitaxially growing and forming the third buffer layer 53.

It is noted that an ion beam assist may be used in forming the third buffer layer 53 if needed, like in the process of forming the first buffer layer 51. More specifically, while irradiating an ion beam on a surface of the second buffer layer 52, the third buffer layer 53 may be formed on the surface. By using an ion beam assist, the third buffer layer 53 can be formed more effectively.

Also, the conditions for forming the third buffer layer 53 are not particularly limited, as long as metal atoms of various kinds reach the second buffer layer 52 in a predetermined ratio (in other words, a composition ratio of the metal oxide having a perovskite structure), and the third buffer layer 53 can be epitaxially grown, and the following conditions can be used, for example.

The frequency of the laser beam may preferably be 30 Hz or lower, and more preferably, 15 Hz or lower. The energy density of the laser beam may preferably be 0.5 J/cm$^2$ or greater, and more preferably, 2 J/cm$^2$ or greater.

The temperature of the substrate 15 with the second buffer layer 52 formed thereon may preferably be about 300-800° C., and more preferably, about 700° C. However, when irradiation of an ion beam is concurrently used, the temperature may preferably be set to about 0-50° C., and more preferably, about room temperature (5-30° C.).

The distance between the substrate 15 with the second buffer layer 52 formed thereon and the target may preferably be 60 mm or less, and more preferably, 45 mm or less.

The pressure inside the vacuum apparatus may preferably be 1 atmospheric pressure or less, in which a partial pressure of oxygen may preferably be about $399 \times 10^{-3}$ Pa ($3 \times 10^{-3}$ Torr). However, when irradiation of an ion beam is concurrently used, the pressure inside the vacuum apparatus may preferably be $133 \times 10^{-1}$ Pa ($1 \times 10^{-1}$ Torr) or less, and more preferably, $133 \times 10^{-3}$ Pa ($1 \times 10^{-3}$ Torr) or less. Also, in this case, the atmosphere inside the vacuum apparatus may preferably be a mixture of inert gas and oxygen at a mixing ratio of about 300:1-10:1 in volume ratio, and more preferably, about 150:1-50:1.

By setting the film forming conditions for the third buffer layer 53 within these ranges, the third buffer layer 53 can be more effectively formed by epitaxial growth. Also, in this instance, the irradiation time of the laser beam and ion beam may be appropriately set, such that the average thickness of the third buffer layer 53 can be adjusted to the thickness described above, in other words, about 30 nm. The irradiation time of the laser beam may differ depending on each of the conditions described above, but, normally, may preferably be about 3-90 minutes, and more preferably, 15-45 minutes.

After the third buffer layer 53 is formed in the manner described above, and the buffer layer 40 is formed, a transition metal oxide layer 42 composed of a transition metal oxide having a perovskite structure is formed on the third buffer layer 53 (the buffer layer 40) as shown in FIG. 2. Because the transition metal oxide layer 42 is formed on the third buffer layer 53 that has an excellent perovskite type crystal structure, a laser ablation method alone may be conducted without using an ion beam assisted method.

More specifically, instead of the target for the third buffer layer 53, the target for the transition metal oxide layer 42 containing the desired SrRuO$_3$ composition or a composition similar to the same is used, and a laser beam is irradiated to the target to pound out atoms including oxygen atoms and metal atoms, thereby generating a plume. Then, the plume is irradiated toward and brought in contact with the third buffer layer 53 on the substrate 15, thereby forming the transition metal oxide layer 42 by epitaxial growth.

The conditions for forming the transition metal oxide layer 42 are not particularly limited, as long as metal atoms of various kinds reach the third buffer layer 53 in a predetermined ratio (in other words, a composition ratio of the metal oxide having a perovskite structure), and the transition metal oxide layer 42 can be epitaxially grown, and for example, conditions similar to the conditions for the laser ablation method and the like used in forming the third buffer layer 53 may be used.

It is noted that an ion beam assist may be used in forming the transition metal oxide layer 42 if needed, like in the process of forming the third buffer layer 53. More specifically, while irradiating an ion beam on a surface of the third buffer layer 53, the transition metal oxide layer 42 may be formed on the surface. By using an ion beam assist, the transition metal oxide layer 42 can be formed more effectively.

Next, the memory layer 31 shown in FIG. 2 is formed on the transition metal oxide layer 42. Because the memory layer 31 is formed on the transition metal oxide layer 42 that has also an excellent perovskite type crystal structure, a laser ablation method alone may be conducted without using an ion beam assisted method, thereby forming the memory layer 31 composed of a magnetic material of a metal oxide having a perovskite structure, such as, for example, La$_{0.7}$Sr$_{0.3}$MnO$_3$. More specifically, instead of the target for the transition metal oxide layer 42, the target for the memory layer 31 containing the desired La$_{0.7}$Sr$_{0.3}$MnO$_3$ composition or a composition similar to the same is used, and a laser beam is irradiated to the target to pound out atoms including oxygen atoms and metal atoms, thereby generating a plume. Then, the plume is irradiated toward and brought in contact with the transition metal oxide layer 42 on the substrate 15, thereby epitaxially growing and forming the memory layer 31 with a (100) orientation.

It is noted here that, as the target for the memory layer 31, the La$_{0.7}$Sr$_{0.3}$MnO$_3$ composition or a compositions similar to the same can be used, and any one of these targets may be appropriately selected depending on targeted characteristics of the memory layer.

The conditions for forming the memory layer 31 are not particularly limited, as long as metal atoms of various kinds reach the transition metal oxide layer 42 in a predetermined ratio (in other words, a composition ratio of the metal oxide having a perovskite structure), and the memory layer 31 can be epitaxially grown, and for example, film forming conditions similar to the conditions for the laser ablation method and the like used in forming the third buffer layer 53 and the transition metal oxide layer 42 may be used.

It is noted that an ion beam assist may be used in forming the memory layer 31 if needed, like in the process of forming the third buffer layer 53. More specifically, while irradiating an ion beam on a surface of the transition metal oxide layer 42, the memory layer 31 may be formed on the surface. By using an ion beam assist, the memory layer 31 having an excellent crystallinity can be formed more effectively, which is advantageous in improving the MR ratio.

Next, an insulating layer 33 shown in FIG. 2 is formed on the memory layer 31. Because the insulating layer 33 is formed on the memory layer 31 that has also an excellent perovskite type crystal structure, a laser ablation method alone may be conducted without using an ion beam assisted method, thereby forming the insulating layer 33 composed of an insulation material of a metal oxide having a perovskite structure, such as, for example, SrTiO$_3$. More specifically, instead of the target for the memory layer 31, the target for the insulating layer 33 containing the desired SrTiO$_3$ composition or a composition similar to the same is used, and a laser beam is irradiated to the target to pound out atoms including oxygen atoms and metal atoms, thereby generating a plume. Then, the plume is irradiated toward and brought in contact with the memory layer 31 on the substrate 15, thereby epitaxially growing and forming the insulating layer 33 whose orientation is controlled in a predetermined direction.

It is noted here that, as the target for the insulating layer 33, a composition formed from $SrTiO_3$ may be used, but other insulation materials having a perovskite structure similar to that of $SrTiO_3$, for example, insulation materials of metal oxides, such as, $CaTiO_3$, $BaTiO_3$, or the like may preferably be used. Any one of these targets may be appropriately selected depending on targeted characteristics of the insulating layer, and its lattice matching property with the constituting materials of the memory layer 31.

The conditions for forming the insulating layer 33 are not particularly limited, as long as metal atoms of various kinds reach the memory layer 31 in a predetermined ratio (in other words, a composition ratio of the metal oxide having a perovskite structure), and the insulating layer 33 can be epitaxially grown, and for example, film forming conditions similar to the conditions for the laser ablation method and the like used in forming the third buffer layer 53 and the memory layer 31 may be used.

It is noted that an ion beam assist may be used in forming the insulating layer 33 if needed, like in the process of forming the third buffer layer 53. More specifically, while irradiating an ion beam on a surface of the memory layer 31, the insulating layer 33 may be formed on the surface. By using an ion beam assist, the insulating layer 33 having an excellent crystallinity can be formed more effectively, and the reliability and uniformity of the tunneling junction section can be improved.

Next, a magnetic fixed layer 45 shown in FIG. 2 is formed on the insulating layer 33. Because the magnetic fixed layer 45 is formed on the insulating layer 33 that has also an excellent perovskite type crystal structure, a laser ablation method alone may be conducted without using an ion beam assisted method, thereby forming the magnetic fixed layer 45 composed of a magnetic material of a metal oxide having a perovskite structure, such as, for example, $La_{0.7}Sr_{0.3}MnO_3$. More specifically, instead of the target for the insulating layer 33, the target for the magnetic fixed layer 45 containing the desired $La_{0.7}Sr_{0.3}MnO_3$ composition or a composition similar to the same is used, and a laser beam is irradiated to the target to pound out atoms including oxygen atoms and metal atoms, thereby generating a plume. Then, the plume is irradiated toward and brought in contact with the insulating layer 33 on the substrate 15, thereby epitaxially growing and forming the magnetic fixed layer 45 with a (100) orientation.

It is noted here that, as the target for the magnetic fixed layer 45, a composition formed from $La_{0.7}Sr_{0.3}MnO_3$ can be used.

The conditions for forming the magnetic fixed layer 45 are not particularly limited, as long as metal atoms of various kinds reach the insulating layer 33 in a predetermined ratio (in other words, a composition ratio of the metal oxide having a perovskite structure), and the magnetic fixed layer 45 can be epitaxially grown, and for example, film forming conditions similar to the conditions for the laser ablation method and the like used in forming the third buffer layer 53 and the memory layer 31 may be used.

It is noted that an ion beam assist may be used in forming the magnetic fixed layer 45 if needed, like in the process of forming the third buffer layer 53. More specifically, while irradiating an ion beam on a surface of the insulating layer 33, the magnetic fixed layer 45 may be formed on the surface. By using an ion beam assist, the magnetic fixed layer 45 having an excellent crystallinity can be formed more effectively, which is advantageous in improving the MR ratio.

Next, an anti-ferromagnetic layer 46 shown in FIG. 2 is formed on the magnetic fixed layer 45, thereby obtaining the TMR element 30 in accordance with an embodiment of the present invention. Because the anti-ferromagnetic layer 46 is formed on the magnetic fixed layer 45 that has also an excellent perovskite type crystal structure, like in the case of forming the transition metal oxide layer 42 and the memory layer 31, a laser ablation method alone may be conducted without using an ion beam assisted method, whereby the anti-ferromagnetic layer 46 can be formed with an excellent crystallinity.

More specifically, instead of the target for the magnetic fixed layer 45, the target for the anti-ferromagnetic layer 46 containing the desired FeMn composition or a composition similar to the same is used, and a laser beam is irradiated to the target to pound out atoms including oxygen atoms and metal atoms, thereby generating a plume. Then, the plume is irradiated toward and brought in contact with the magnetic fixed layer 45 on the substrate 15, thereby epitaxially growing and forming the anti-ferromagnetic layer 46.

The conditions for forming the anti-ferromagnetic layer 46 are not particularly limited, as long as metal atoms of various kinds reach the magnetic fixed layer 45 in a predetermined ratio (in other words, a composition ratio of the metal oxide having a perovskite structure), and the anti-ferromagnetic layer 46 can be epitaxially grown, and for example, film forming conditions similar to the conditions for the laser ablation method and the like used in forming the third buffer layer 53 and the memory layer 31 may be used.

It is noted that an ion beam assist may be used in forming the anti-ferromagnetic layer 46 if needed, like in the process of forming the magnetic fixed layer 45. More specifically, while irradiating an ion beam on a surface of the magnetic fixed layer 45, the anti-ferromagnetic layer 46 may be formed on the surface. By using an ion beam assist, the anti-ferromagnetic layer 46 having an excellent crystallinity can be formed more effectively, and the anti-ferromagnetic layer 46 that can firmly fix the magnetization direction of the magnetic fixed layer 45, in spite of its small film thickness, can be obtained.

The inventors of the present invention analyzed the TMR element 30 thus obtained by X-ray diffraction, and confirmed that each of the layers composing the TMR element 30 was an epitaxial film that was excellently oriented, and the memory layer 31 and the magnetic fixed layer 45 had a perovskite structure with a (100) orientation.

Accordingly, in the TMR element 30 in accordance with the present embodiment, the memory layer 31 and the magnetic fixed layer 45 have excellent magnetic characteristics, and the insulating layer 33 that is a tunneling barrier layer has an excellent orientation and is uniformly formed, which makes the TMR element to have a high performance. Also, because the TMR element 30 can be directly formed into the substrate 15, there is almost no restriction on the surface conditions of the substrate 15 where the TMR element 30 is to be formed, and the TMR element 30 can be effectively manufactured at a low cost.

Magnetic Memory Device

Next, a magnetic memory device in accordance with the present invention is described with reference to FIG. 3 through FIG. 5.

Figure 3:
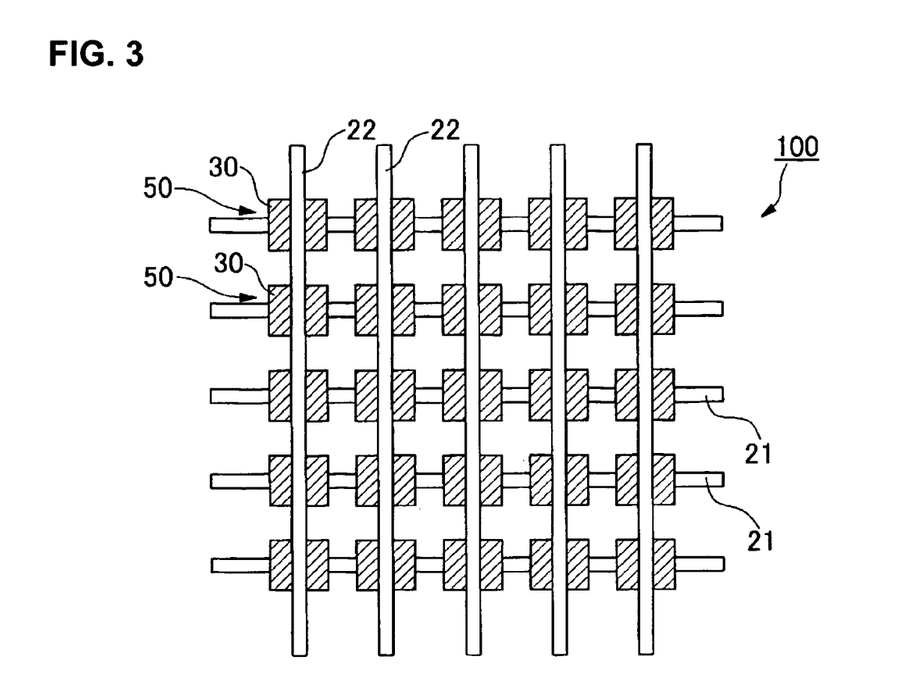
FIG. 3 is a plan view of a structure of an example of a magnetic memory device.

FIG. 3 is a plan view of a structure of a magnetic memory device 100 equipped with TMR elements 30 in accordance with the embodiment described above as its memory cells, and FIG. 4 is a cross-sectional view of the structure of the memory cells.

The magnetic memory device 100 is equipped with a plurality of word lines 21 and a plurality of bit lines 22 that extend in directions mutually crossing in a plan view, and is a cross-point type magnetic memory device in which memory cells 50 equipped with TMR elements of the aforementioned embodiment are disposed at positions corresponding to intersections of the word lines 21 and the bit lines 22. Accordingly, by selecting one of the word lines 21 and one of the bit lines 22, the memory cell 50 at their intersection is selected for a writing or reading operation.

Figure 4:
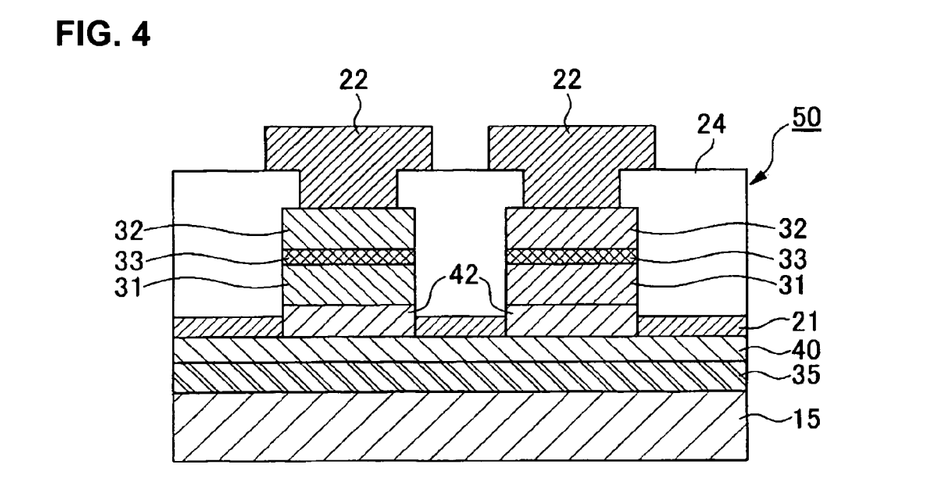
FIG. 4 is a cross-sectional view of a structure of a memory cell shown in FIG. 3.

As shown in the cross-sectional structural view of the memory cell 50 in FIG. 4, a buffer layer 40 and a transition metal oxide layer 42 are formed over a substrate 15 through an insulating layer 35, and a tunneling junction section composed of a memory layer 31, an insulating layer 33 and a fixed magnetic layer 32 is provided on the transition metal oxide layer 42. The tunneling junction section is covered by an interlayer insulating layer 24 having a contact hole provided on its top surface section through which the bit line 22 and the fixed magnetic layer 32 are connected. It is noted that a pn junction diode (omitted in the figure) is provided between the bit line 22 and the fixed magnetic layer 32 (anti-ferromagnetic layer 46), wherein an n-layer and a p-layer of the diode are stacked in this order from the side of the fixed magnetic layer 32. Also, the word line 21 is formed in a manner to connect adjacent ones of the transition metal oxide layers 42.

In the magnetic memory device 100 equipped with the structure described above, its memory cell 50 is equipped with the TMR element 30 of the aforementioned embodiment, such that a large MR ratio can be obtained due to excellent magnetic characteristics of its memory layer and magnetic fixed layer, and variations in the characteristics among the memory cells are few due to the uniformity of the insulating layer that composes the tunneling barrier layer.

Also, as shown in FIG. 4, the buffer layer 40 can be formed in a manner to be commonly shared by the TMR elements 30 of the plurality of memory cells 50. In this case, the first buffer layer (YSZ) 51 included in the buffer layer 40 can be used as an etching stopper, which also contributes to an excellent facility in manufacturing.

Figure 5:
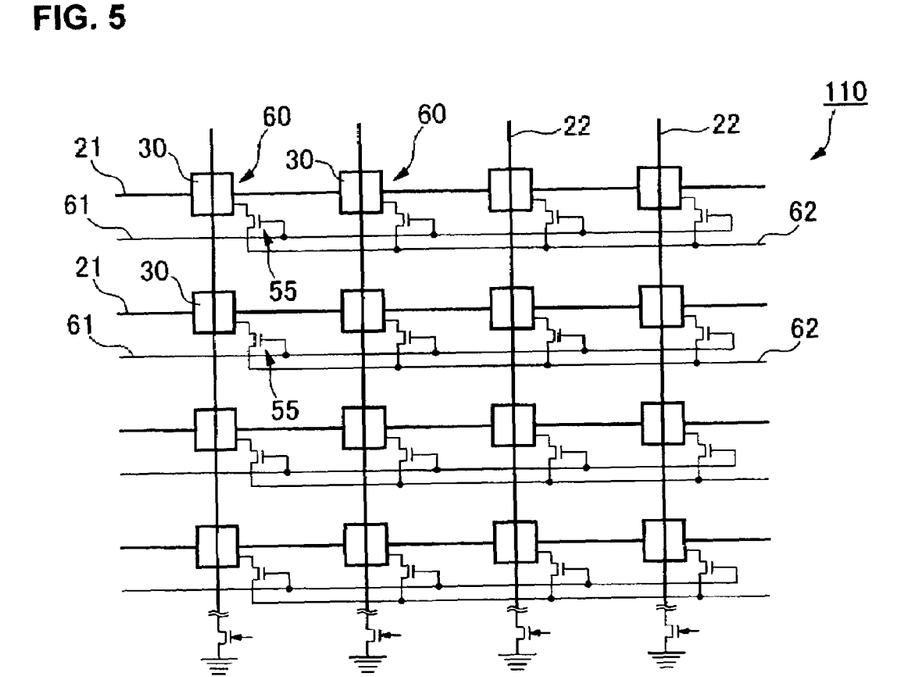
FIG. 5 is a plan view of a structure of another example of a magnetic memory device.

Also, the TMR element 30 of the aforementioned embodiment can be ideally used in a selective transistor type magnetic memory device 110 shown in FIG. 5. FIG. 5 shows a plan view of a structure of the magnetic memory device in accordance with another embodiment of the present invention, and FIG. 6 shows a cross-sectional view of a structure of a memory cell 60 shown in FIG. 5.

The magnetic memory device 110 is equipped with a plurality of word lines 21 and a plurality of bit lines 22 that extend in directions mutually crossing in a plan view, and is equipped with a structure in which memory cells 60 equipped with TMR elements 30 of the aforementioned embodiment are disposed at positions corresponding to intersections of the word lines 21 and the bit lines 22, respectively. Also, sense lines 62 and gate lines 61 that extend along the word lines 21 are provided, and selection transistors 55 are interposed between the wirings 61 and 62 and the TMR elements 30

Figure 6:
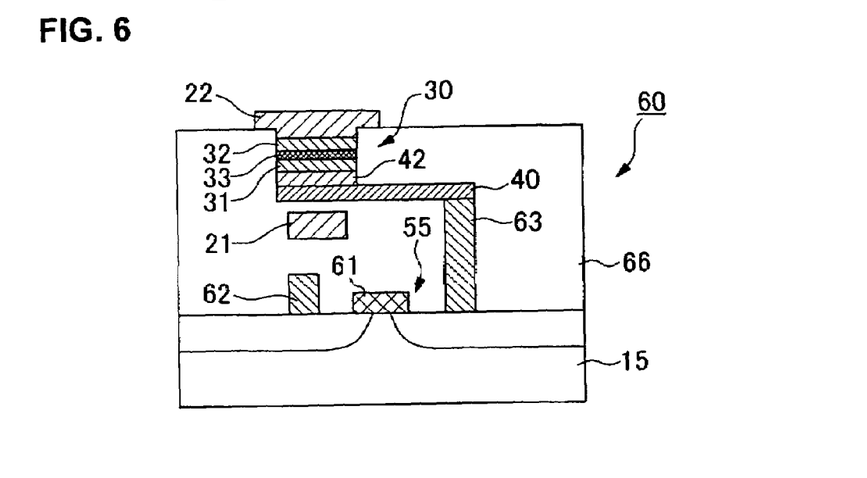
FIG. 6 is a cross-sectional view of a structure of a memory cell shown in FIG. 5.

As shown in the cross-sectional view of the structure of FIG. 6, a selection transistor 55 that is equipped with a gate electrode (gate line) 61, a source electrode (sense line) 62 and a drain electrode 63 is provided on a semiconductor substrate 15, and a TMR element 30 is provided above the selection transistor 55 through an insulating layer 66. The drain electrode 63 of the selection transistor 55 and the TMR element 30 are electrically connected by a buffer layer 40. The TMR element 30 is equipped with a transition metal oxide layer 42 formed on the buffer layer 40, a tunneling junction section composed of a memory layer 31, an insulating film 33 and a fixed magnetic layer 32 is provided on the transition metal oxide layer 42, and the fixed magnetic layer 32 and the bit line 22 are connected. Also, the word line 21 is disposed opposite to the buffer layer 40 on the under layer side of the tunneling junction section through an insulating layer In the magnetic memory device 110 equipped with the structure described above, writing and reading operations can be selectively performed only at those of the memory cells 60 that are placed in a selected state by the selection transistors 55, such that the magnetic memory device can effectively prevent operational interferences from occurring among the plurality of memory cells arranged, and excels in operational stability.

Also, because the TMR element 30 of the aforementioned embodiment is provided, a large MR ratio can be obtained due to excellent magnetic characteristics of its memory layer and magnetic fixed layer, and variations in the characteristics among the memory cells are few due to the uniformity of the insulating layer that composes the tunneling barrier layer.

What is claimed is:

1. A magnetoresistance effect element comprising:
a first buffer layer formed of yttria stabilized zirconia (YSZ), a second buffer layer formed of $CeO_2$, a third buffer layer formed of $YBa_2Cu_3O_x$, a transition metal oxide layer, a lower magnetic layer, an insulating layer and an upper magnetic layer successively stacked on a base substrate, wherein:
the transition metal oxide layer has a predetermined orientation plane.

2. The magnetoresistance effect element according to claim 1, wherein the lower magnetic layer includes a layer composed of a magnetic material having a perovskite structure.

3. The magnetoresistance effect element according to claim 1, wherein the transition metal oxide layer is composed of a transition metal oxide having a perovskite structure.

4. The magnetoresistance effect element according to claim 3, wherein the transition metal oxide layer is a (100) oriented epitaxial film.

5. The magnetoresistance effect element according to claim 3, wherein the transition metal oxide layer is composed of at least one of the group including $SrRuO_3$, Nb—$SrTiO_3$, La—$SrTiO_3$, and (La, Sr) $CoO_3$.

6. The magnetoresistance effect element according to claim 1, wherein the transition metal oxide layer is formed in a film by an ion beam assisted method.

7. The magnetoresistance effect element according to claim 1, wherein the transition metal oxide layer is formed in a film over the base substrate through a buffer layer formed in a film by an ion beam assisted method.

8. The magnetoresistance effect element according to claim 7, wherein at least one of the buffer layers is a (100) oriented epitaxial film.

9. The magnetoresistance effect element according to claim 7, wherein at least one of the buffer layers is composed of an oxide having an NaCl structure, a fluorite structure, or a layered perovskite structure.

10. The magnetoresistance effect element according to claim 1, wherein the insulating layer is an epitaxial film that is crystal-grown on the lower magnetic layer.

11. The magnetoresistance effect element according to claim 10, wherein the insulating layer is composed of an insulating material of a metal oxide having a perovskite structure.

12. The magnetoresistance effect element according to claim 10, wherein the upper magnetic layer includes an epitaxial film that is crystal-grown on the insulating layer.

13. The magnetoresistance effect element according to claim 12, wherein the upper magnetic layer is composed of a magnetic material of a metal oxide having a perovskite structure.

14. The magnetoresistance effect element according to claim 1, wherein at least a surface of the base substrate is composed of an insulating oxide or an organic insulating material having an amorphous structure.

15. A magnetic memory device equipped with a plurality of memory cells arranged on a base substrate, wherein each of the memory cells is equipped with the magnetoresistance effect element recited in claim 1.

16. The magnetic memory device according to claim 15, wherein a wiring connected to the memory cell is formed on the base substrate, and a transition metal oxide layer or a buffer layer of the magnetoresistance effect element forms at least a part of an electroconductive connecting section between the wiring and the memory cell.

17. The magnetic memory device according to claim 15, wherein the magnetoresistance effect element is formed through a buffer layer over the base substrate, and the plurality of the memory cells commonly share the buffer layer.

* * * * *